United States Patent [19]

Turunen

[11] Patent Number: 5,278,528
[45] Date of Patent: Jan. 11, 1994

[54] AIR INSULATED HIGH FREQUENCY FILTER WITH RESONATING RODS

[75] Inventor: Aimo Turunen, Oulu, Finland

[73] Assignee: Lk-Products OY, Kempele, Finland

[21] Appl. No.: 861,073

[22] Filed: Mar. 31, 1992

[30] Foreign Application Priority Data

Apr. 12, 1991 [FI] Finland .................. 911799

[51] Int. Cl.⁵ ................... H01P 1/205; H01P 1/20
[52] U.S. Cl. ........................ 333/203; 333/222
[58] Field of Search ............. 333/202, 203, 204, 205, 333/219, 246, 247, 222

[56] References Cited

U.S. PATENT DOCUMENTS

| | | | |
|---|---|---|---|
| 3,889,214 | 6/1975 | Petitjean et al. | 333/203 |
| 5,047,739 | 9/1991 | Kuokkanen | 333/202 X |
| 5,124,675 | 6/1992 | Komazaki et al. | 333/204 |
| 5,142,255 | 8/1992 | Chang et al. | 333/204 |

Primary Examiner—Robert J. Pascal
Assistant Examiner—Seung Ham
Attorney, Agent, or Firm—Darby & Darby

[57] ABSTRACT

An inexpensive and lightweight air insulated high frequency filter can be made utilizing a radio device's frame and a printed board (15) intended for electrical circuits, so that during manufacture of the printed board (15) it is machined so that several side by side finger-like projecting tongues ($14_1$, $14_2$, $14_3$, $14_4$) are formed, which are entirely coated with electrically conducting material. Thereafter the printed board, on which electrical and mechanical components intended for it are mounted, is placed in the radio device's crate-like frame made of conducting material and possibly provided with partition walls (18, 19), and on which also cover parts are fastened so that the tongues will be parallel with them and located between them, whereby the tongues, the enclosing cover parts and the frame wall parts form a filter structure.

11 Claims, 2 Drawing Sheets

AIR INSULATED HIGH FREQUENCY FILTER WITH RESONATING RODS

BACKGROUND OF THE INVENTION

1. Field of the Invention

The present invention relates to an air insulated high frequency filter suitable for use in radio devices.

2. Discussion of Related Art

Radiotelephone manufacturers typically use individual RF filters bought from their manufacturer as separate components already tuned to specifications. Filters based on quarter-wave resonators, such as air insulated rod resonators, helix resonators and ceramic resonators, are thus ready made assemblies encapsulated by the manufacturer in a metal case having solder ears to be fixed on a printed board and connectors for the electrical interface. Even from the beginning of the design, a radiotelephone manufacturer takes into account the mounting of filters so that within the radiotelephone frame, which is usually a structure containing compartments and made by casting or possibly by pressing and bending sheet metal, an compartment is usually allocated for the high frequency filters, such as the duplexer. The frame can also be made of plastics or similar material, which at least partially is coated with a conducting material. Besides the filters, there are separate compartments for the high frequency sections of the transmitter and receiver paths, for the logic and for the synthesizers.

The printed boards located in the compartments are shielded with metallic RF covers at the upper side and possibly below, while the compartment side walls belonging to the frame provide the sideways shielding. This known compartment structure of the frame is able to prevent mutual interference between different functional blocks, or the so called electromagnetic interference. In the assembly of a radiotelephone the printed boards with components attached to them are placed in the frame, and the boards are electrically interconnected. Thus also ready made encapsulated filters are attached to the printed boards, the filters and the printed circuit boards requiring connectors for mechanical as well as for electrical connection.

It is also known to manufacture filters realized by strip line resonators, directly on the printed board's surface, whereby the desired resonator pattern is etched on the printed board in connection with its manufacture. Good accuracy and reproducibility are advantages of this method.

The commonly used technique of this type has some disadvantages. The compartment structure may well lead to using the available space of the radiotelephone in a way which is not optimal, but where e.g. the encapsulated antenna filters stand in their own compartment with plenty of space around them. From the point of view of high frequency filters it is unnecessary to place them in their own compartments, even covered by possible RF covers, because the manufacturer always supplies the filters with a housing. The encapsulated individual filters require a printed board as a mounting base, from where signals are transmitted through an expensive connector and a cable to the front end of the receiver, and correspondingly a separate connector and cable to supply signals from the transmitter output stage to the duplex filter. Said mounting must further be somehow fixed to the frame compartment. A filter realized with strip line resonators requires an excellent Q factor, which is not easily obtained on a common printed board substrate.

SUMMARY OF THE INVENTION

This invention presents a way in which filters based on quarter-wave resonators can be placed in a radiotelephone, easily and without the above mentioned disadvantages of the prior art. The objective is to obtain a resonator structure where it is possible to utilize the conducting partition walls and covers, which are inherent parts of a radiotelephone, and where no expensive connector elements are required for mechanical and electrical interfaces.

According to the invention, there is no filter is made as an individual component, but the filter is made as a part of the manufacturing process of the printed board, which in any case is needed in the radiotelephone. Material is cut or milled away from the printed board at selected locations, so that finger-like projecting tongues are obtained. The tongues are entirely coated with conducting material, e.g. copper. If the original printed board is a board coated with copper on both sides, it suffices to coat only the cut edges. The bases of the fingers can be interconnected through the foil of the printed board. In this way conductor rods of an air insulated rod resonator are formed directly on the printed board, on which may be freely mounted also other components needed in the telephone. In an easy and simple way the resonator can be connected to form a functional part of the rest of the circuit, because the input and output conductors can be formed directly on the printed board, obviating the need for separate connectors and cables. When the printed board is mounted in the housing of the device, care is taken to locate the resonator fingers in relation to the frame and the metallic cover parts so that the metallic frame parts and the metal covers to be fastened to the frame will surround the fingers at a suitable distance and essentially on all sides. The resonator rods can be cut to form a filter of the comb type, or an interdigital filter. The printed board resonator is particularly well suited for a duplex filter.

BRIEF DESCRIPTION OF THE DRAWINGS

The invention is illustrated in further detail referring to the enclosed basic figures, in which.

DESCRIPTION OF THE PREFERRED EMBODIMENT

Figure 1:
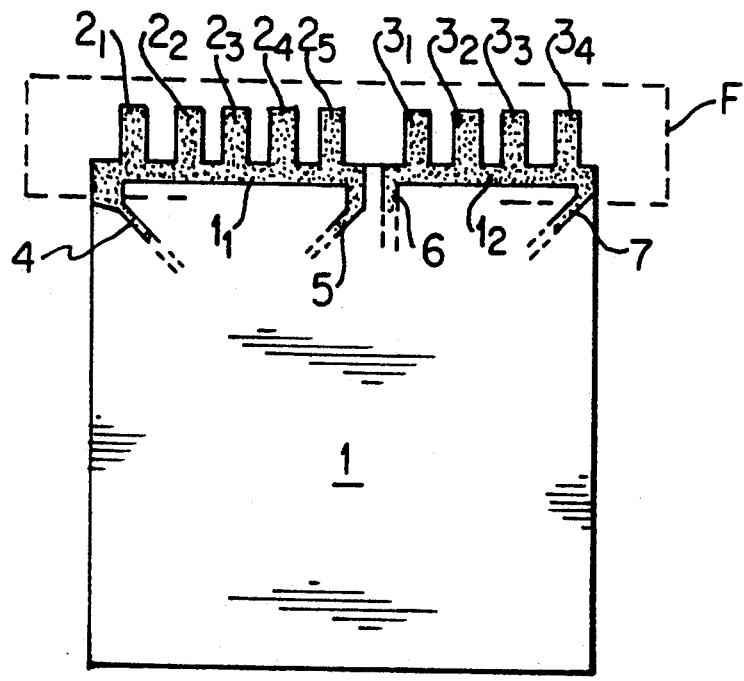
FIG. 1 shows a printed board, where the filter is made at the edge of the board.

FIG. 1 shows a printed circuit board 1 which could be of any type used in the art, a single-layer board or a multilayer printed board. The printed board is cut to a form determined by the components to be mounted on it, and by the available space within the frame of the radiotelephone. After cutting, a circuit pattern is transferred to the board in a normal way by etching, and then required holes are drilled and electrical and mechanical components are mounted. The above mentioned are conventional actions which do not require detailed description. At the same time as the printed board is cut into its form, material is cut away from its edge to form a plurality of tongues or fingers $2_1$-$2_5$ belonging to the first filter, e.g. to the duplex filter on the transmit side, and fingers $3_1$-$3_4$ belonging to a second filter, e.g. to the duplex filter on the receiver side. The filters are together in the area F. The fingers are entirely coated with conducting material, and conductor strips $1_1$ and $1_2$ are arranged to interconnect their bases. As is usual in a printed board containing RF parts, the original printed board 1 is coated with copper on both sides. Then the circuit mask would already take care that the copper foil will cover the fingers on both sides after etching of the mask. After etching the edges of the fingers are coated by any known method, e.g. by coating with copper, tin or a conducting material. In the design of the circuit pattern mask, conductor strips 4, 5, 6 and 7 from the ends of the strips $1_1$ and $1_2$ connecting the fingers are drawn to those points on the printed board to where signals are supplied from the filter and from where signal are connected to the filter. Thus no separate cables and connectors are required.

Figure 2:
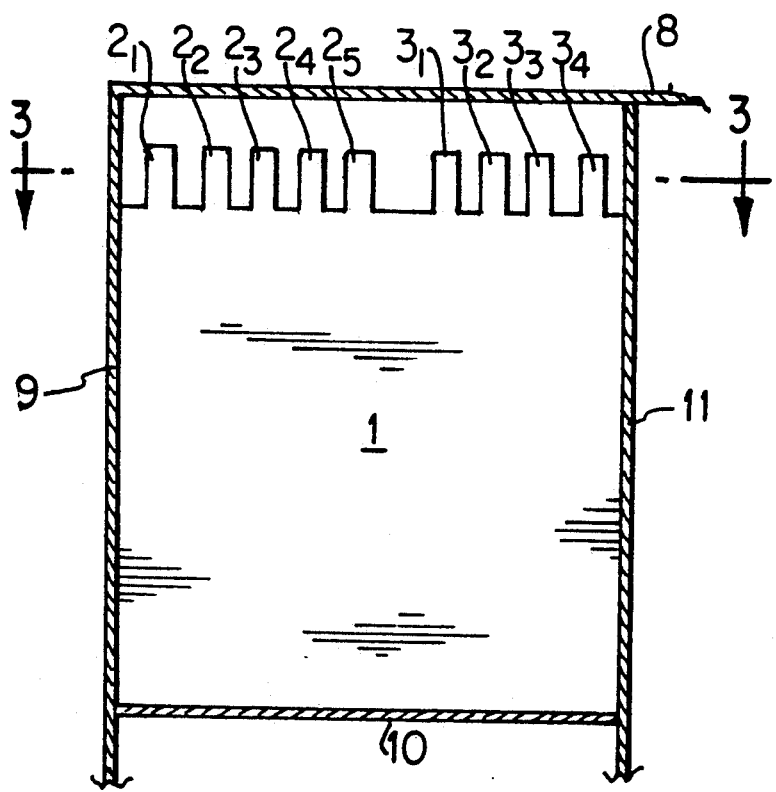
FIG. 2 shows the printed board of FIG. 1 mounted in a radiotelephone frame, seen from above.
Figure 3:
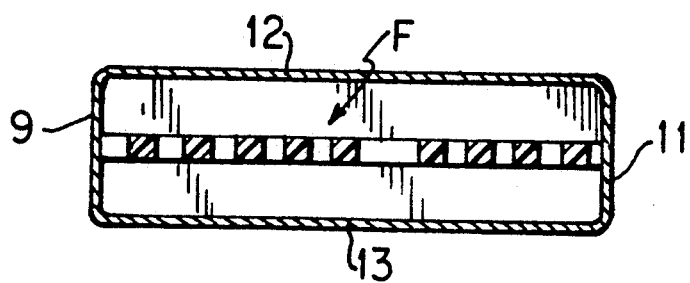
FIG. 3 is a section taken along the lines 3—3 of FIG. 2.

When the printed board containing the resonator body or the body of resonators is ready, required IC circuits and individual components as well as connectors are mounted on it. Then the ready and assembled printed board is fastened to the frame of the radiotelephone. The fastening method could be any commonly used method. According to FIG. 2 it may be located in a corner section of the frame, defined by outer walls 8 and 9 of the frame and walls 10 and 11 of the compartments. The printed board 1 is dimensioned so that this compartment suitably can accommodate it. The printed board 1 containing the filter body, or the fingers $2_1$-$2_5$ and $3_1$-$3_4$, is placed into the frame so that, according to FIG. 3, it will be located in the middle of the frame. Thereafter the covers 12 and 13 are fastened to the frame, whereby there is an equal distance from the printed board filter F to the cover 12 and to the cover 13 covering the other face of the frame, which is the most favorable situation regarding the operation of the resonators. If required, it is possible to arrange adjusting means in the cover 12 or 13 or in the housing wall 8, e.g. tongues to be bent away from the cover or the housing, or adjusting screws fastened to the tongues, in order to tune the resonance frequency of the resonators. To a person skilled in the art these are obvious facts, not essential regarding this invention.

Figure 4:
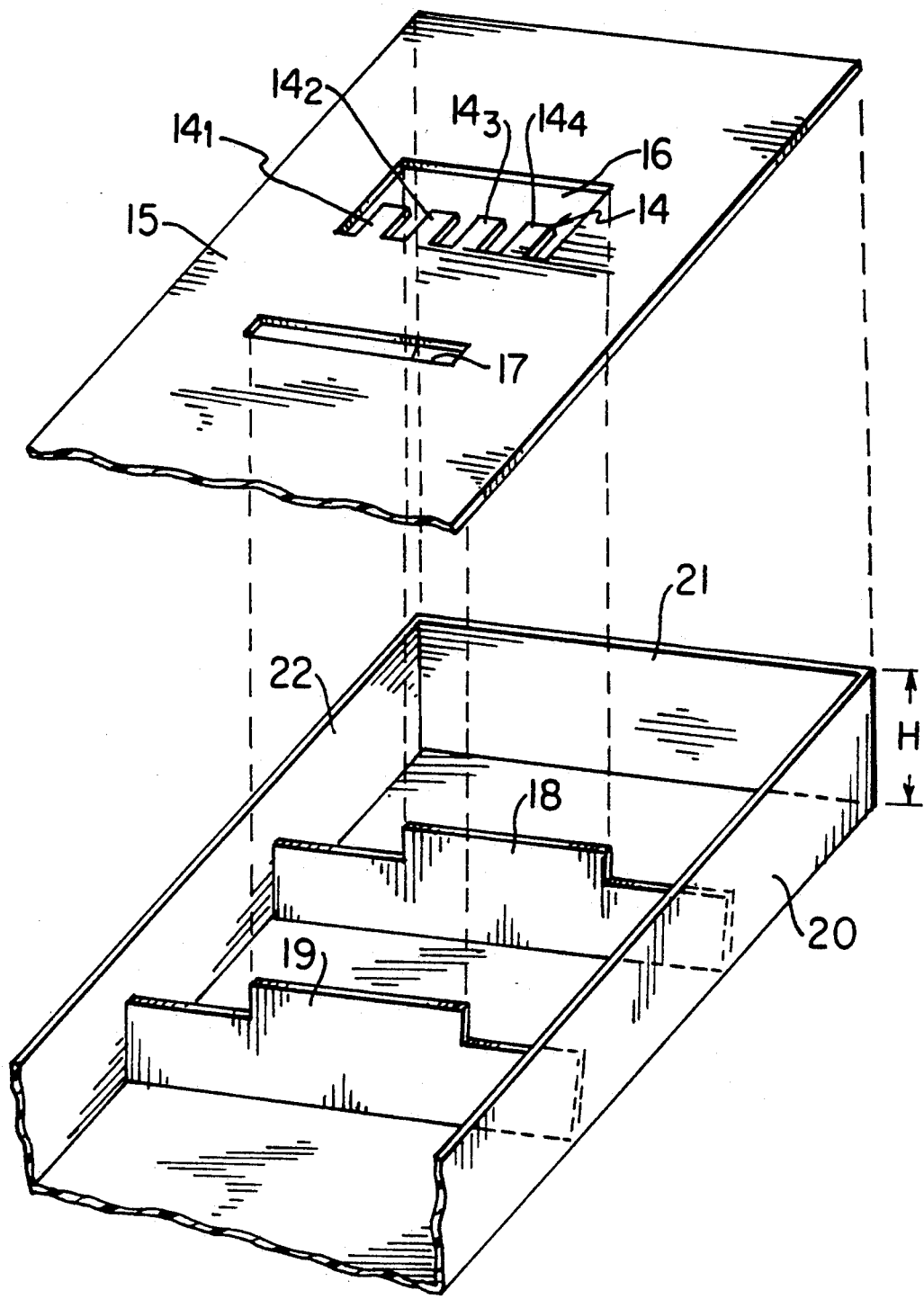
FIG. 4 shows a printed board, the filter being made in the middle of the board, and its mounting in a radiotelephone frame.

FIG. 4 shows a further embodiment. This differs from that in FIG. 2 in that the filter body, the fingers $14_1$-$14_4$, are cut in the middle of the printed board 15 so that there is an opening in front of them. A slot 17 is cut behind the fingers, at right angles to the finger direction. The fingers are entirely coated with conducting material, as described above referring to FIG. 1, and the fingers forming the body of the resonator are connected via printed board conductor strips (not shown) directly to the electrical circuits mounted on the printed board. A printed board of this type, together with its resonators, is placed in the radiotelephone housing with suitably arranged partitions, so that one partition wall 19 passes through the slot 17, and another partition wall 18 passes through the opening 16 close to the edge opposite the fingers. The frame walls 20, 21, 22 represent the radiotelephone's outer walls surrounding the printed board 15 in three directions. When the frame is made, partition walls 18 and 19 are also made with a height which for a part of the length is somewhat less than half of the frame height H, and for a part of the length their height is H (equal to the height of the part remaining below the printed board 15 + the height of the partial walls 18 and 19). In the assembly the printed board 15 is placed in the frame into the space defined by walls 20, 21, 22, so that the frame partial wall 18 penetrates the printed board slot 17 and the partial wall 19 penetrates the opening 16 close to the edge opposite the fingers $14_1$-$14_4$. The partial wall 18 is soldered adjacent the printed board slot. When the printed board is at least partly shielded on both sides by a cover (not shown), the width of which is equal to the distance between the partial walls 18 and 19, and the length of which is at least equal to the length of the partial walls, the covers covering the opening 16 and the fingers, then the fingers are located at an equal distance from each cover, whereby the fingers can operate as resonators and form a filter.

The filter according to the invention is very advantageously realized, because no separate printed board, interface or housing is required, but the filter can be manufactured together with the printed boards which anyway are used in the telephone. Although it is possible to use inexpensive material for the printed board it is possible to obtain low filter losses. A small filter size is not necessarily achieved, but on the other hand the filter is very light-weight.

The means described above are only intended to illustrate the inventive idea in order to realize a filter which utilizes the printed board and the frame of the radiotelephone. Thus the invention is by no means restricted to these examples, but there is a vast number of implementation alternatives according to the claims. The device could be some other radio frequency device than a radiotelephone. It is possible to cut the resonator fingers in any place on the printed board, and there are no restrictions on the form of individual fingers or on the number of filters they form. The electrical characteristics, e.g. the harmonic properties of the filter can be influenced by the form of the fingers. It is even conceivable that fingers form the body of a helix resonator, whereby the filter would be of a so called "lying helix" type. In the embodiment of FIG. 4 the partial walls belong to the radiotelephone frame, but is also possible to use separate metal plates that are fastened on the printed board and that function as resonator ground plate towards the sides. It is also possible to attach, e.g. by soldering, flange-like parts to the finger ends in order to increase their capacitive coupling in a known way. Depending on the location of the filters in relation to the side walls of the frame, resonance frequency adjusting members can be placed, in accordance with prior art, in the frame side wall, in the partial walls or in the covers between which the resonators are situated.

I claim:

1. An air insulated high frequency filter structure useful in a radio device, comprising:
    a plurality of resonating rods, an electrically conducting case at least partly encasing the rods, said rods and said case being arranged with respect to each other to define an air space therebetween, said rods being elongated finger-like tongues entirely coated with electrically conducting material and which extend from a printed circuit board within said case, said tongues each extending from respective bases and terminating at respective tips spaced from said printed circuit board, said case having a frame and at least one cover attached to said frame, said frame including a conductive wall, said tips being spaced from said conductive wall, said cover being made of an electrically conductive material, said tongues being spaced from said cover, whereby said tongues, said cover, and said wall form the filter structure.

2. A structure as in claim 1, wherein said conductive wall extends perpendicular to said tongues, said cover extending parallel to said tongues.

3. A structure as in claim 1, further comprising partition walls within said casing, one of said partition walls extending from said conductive wall and the other extending from one partition wall, whereby said partition walls also form the filter structure.

4. A structure as in claim 1, wherein said printed circuit board has a rectangular shaped opening, said tongues extending into said opening.

5. A structure as in claim 1, wherein said printed circuit board has an elongated slot extending in a direction perpendicular to the direction of elongation of said tongues and spaced from said tongues at a location closer to said bases of said tongues than to said tips of said tongues, said slot having a length at least equal to a total distance of an addition of a respective width of each of said tongues plus distances between neighboring ones of said tongues.

6. A structure as in claim 5, further comprising a partition wall which extends from said frame and has a first rectangular area projecting through said slot to form a wall of said filter structure.

7. A structure as in claim 4, further comprising a partition wall which extends from said frame and has a rectangular area projecting through said rectangular shaped opening at a location which is between said tips and an edge of said opening directly opposite said tips.

8. A structure as in claim 1, wherein said printed circuit board has conductor strips extending away from said tongues and which are in electrical connection with said tongues.

9. A structure as in claim 1, further comprising another cover attached to said frame, said tongues being arranged between said cover and said another cover.

10. A structure as in claim 1, wherein said printed circuit board has conductor paths in electrical connection with said tongues for making electrical connection with components mounted on said printed circuit board.

11. A structure as in claim 9, wherein said tongues are spaced from each of said covers by the same distance.

* * * * *